(12) United States Patent
Kojima et al.

(10) Patent No.: US 11,348,915 B2
(45) Date of Patent: May 31, 2022

(54) SEMICONDUCTOR DEVICE HAVING STACKED FIELD EFFECT TRANSISTORS

(71) Applicant: Samsung Electro-Mechanics Co., Ltd., Suwon-si (KR)

(72) Inventors: Masakazu Kojima, Suwon-si (KR); Yun Tae Nam, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 119 days.

(21) Appl. No.: 16/435,765

(22) Filed: Jun. 10, 2019

(65) Prior Publication Data

US 2020/0168602 A1 May 28, 2020

(30) Foreign Application Priority Data

Nov. 27, 2018 (KR) .................. 10-2018-0148944

(51) Int. Cl.
*H01L 27/088* (2006.01)
*H01L 25/07* (2006.01)
(Continued)

(52) U.S. Cl.
CPC ........ *H01L 27/088* (2013.01); *H01L 23/5226* (2013.01); *H01L 25/074* (2013.01);
(Continued)

(58) Field of Classification Search
CPC .................. H01L 25/074; H01L 27/088; H01L 29/42356; H01L 29/45; H01L 29/78; H01L 23/5226; H01L 29/41725
(Continued)

(56) References Cited

U.S. PATENT DOCUMENTS 6,657,243 B2 * 12/2003 Kumagai ............ H01L 27/1104
257/206
7,560,346 B2 * 7/2009 Igarashi .............. H01L 27/0207
257/319
(Continued)

FOREIGN PATENT DOCUMENTS

| JP | 2007-273918 A | 10/2007 |
|---|---|---|
| KR | 10-2009-0131414 A | 12/2009 |
| KR | 10-2012-0090798 A | 8/2012 |

OTHER PUBLICATIONS

Kim, Youngmin et al., "Analysis and Design of Millimeter-Wave Power Amplifier Using Stacked-FET Structure", *IEEE Transactions on Microwave Theory and Techniques*, vol. 63, No. 2, Feb. 2015 (pp. 691-702).

(Continued)

*Primary Examiner* — Ori Nadav
(74) *Attorney, Agent, or Firm* — NSIP Law

(57) ABSTRACT

A semiconductor device includes a substrate, a first FET part and a second FET part disposed on a surface of the substrate. The first FET part includes a first gate electrode region and a first source electrode region spaced apart from each other. The second FET part, connected to the first FET part in a stacked structure, includes a second gate electrode region and a second drain electrode region spaced apart from each other. Each of the first FET part and the second FET part includes a first common electrode and a second common electrode disposed on the surface of the substrate and spaced apart from each other. Each of the first common electrode and the second common electrode is configured to be a (Continued)

single conductor wiring integrally formed by a first drain electrode of the first FET part and a second source electrode of the second FET part.

18 Claims, 11 Drawing Sheets

(51) Int. Cl.
    *H01L 23/522*    (2006.01)
    *H01L 29/78*     (2006.01)
    *H01L 29/417*    (2006.01)
    *H01L 29/423*    (2006.01)
    *H01L 29/45*     (2006.01)

(52) U.S. Cl.
    CPC .. *H01L 29/41725* (2013.01); *H01L 29/42356* (2013.01); *H01L 29/45* (2013.01); *H01L 29/78* (2013.01)

(58) Field of Classification Search
    USPC .......................................................... 257/368
    See application file for complete search history.

(56) References Cited

U.S. PATENT DOCUMENTS

| | | | | |
|---|---|---|---|---|
| 2007/0228424 A1* | 10/2007 | Igarashi | .............. | H01L 27/0605 257/256 |
| 2012/0199847 A1* | 8/2012 | Takagi | ................ | H01L 29/7786 257/77 |
| 2015/0027758 A1* | 1/2015 | Maeda | ................ | H05K 1/0366 174/255 |

OTHER PUBLICATIONS

Helmi, Sultan R. et al., "High-Efficiency Microwave and mm-Wave Stacked Cell CMOS SOI Power Amplifiers", *IEEE Transactions on Microwave Theory and Techniques*, vol. 64, No. 7, Jul. 2016 (pp. 2025-2038).

Korean Office Action dated Mar. 27, 2020 in corresponding Korean Patent Application No. 10-2018-0148944 (7 pages in English, 5 pages in Korean).

* cited by examiner

I – I'

II – II'

III – III'

SEMICONDUCTOR DEVICE HAVING STACKED FIELD EFFECT TRANSISTORS

CROSS-REFERENCE TO RELATED APPLICATION(S)

This application claims the benefit under 35 USC 119(a) of Korean Patent Application No. 10-2018-0148944 filed on Nov. 27, 2018 in the Korean Intellectual Property Office, the entire disclosure of which is incorporated herein by reference for all purposes.

BACKGROUND

1. Field

The following description relates to a semiconductor device having stacked field effect transistors (FETs).

2. Description Of Related Art

A cascode-type high-frequency power amplifier that uses a submillimeter wave, mounted on mobile phones, typically has a high output and high performance.

A cascode-type structure may be used to increase an output of a power amplifier (PA) in a radio frequency (RF) front end (FE) integrated circuit (IC) in which the PA is of a frequency band of 28 GHz, and includes a low noise amplifier (LNA) and an RF switch.

Typically, a power amplifier circuit may include a plurality of field effect transistors (FETs) configured in a cascode manner. The plurality of FETs to be configured in a cascode manner are formed independently of each other, some of the drain electrodes and source electrodes of corresponding FETs may be connected to each other through separate conductor patterns in the cascade structure.

A typical power amplifying apparatus having stacked FETs as described above typically has performance (gain and efficiency) signal pattern degradation at a high frequency, e.g. 28 GHz.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a substrate, a first field effect transistor (FET) part and a second FET part. The first FET part, disposed on a surface of the substrate, includes a first gate electrode region and a first source electrode region disposed on the surface of the substrate and spaced apart from each other. The second FET part, disposed on the surface of the substrate and connected to the first FET part in a stacked structure, includes a second gate electrode region and a second drain electrode region disposed on the surface of the substrate and spaced apart from each other. Each of the first FET part and the second FET part includes a first common electrode and a second common electrode disposed on the surface of the substrate and spaced apart from each other. Each of the first common electrode and the second common electrode is configured to be a single conductor wiring integrally formed by a first drain electrode of the first FET part and a second source electrode of the second FET part.

The first common electrode may be linearly and parallelly disposed with the second common electrode.

The first gate electrode region may include first gate electrode fingers, spaced apart from each other, disposed on a first conductor layer formed on the surface of the substrate, and a first gate electrode pad disposed on the first conductor layer and connected to the first gate electrode fingers.

The first source electrode region may include a pair of first source electrode pads, spaced apart from each other, disposed on the first conductor layer, and a first source electrode finger disposed on the first conductor layer, disposed between the pair of first source electrode pads, and spaced apart from the pair of first source electrode pads.

The second gate electrode region may include second gate electrode fingers, spaced apart from each other, disposed on the first conductor layer, and a second gate electrode bus disposed on the first conductor layer and connected to the second gate electrode fingers.

The second drain electrode region may include second drain electrode fingers disposed on the first conductor layer and spaced apart from each other by the first common electrode and the second common electrode, and a second drain electrode pad disposed on the first conductor layer and spaced apart from the second drain electrode fingers.

The second gate electrode bus may be disposed after the first and second common electrodes and before the second drain electrode pad, and spaced apart from each of the first and second common electrodes and the second drain electrode pad.

The first source electrode region may further include a first source connection electrode disposed on a second conductor layer and connected to the first source electrode finger and the pair of first source electrode pads. The second conductor layer may be stacked on the first conductor layer.

The second drain electrode region may further include a second drain connection electrode disposed on the second conductor layer and connected to the second drain electrode fingers and the second drain electrode pad.

The first gate electrode region may further include a first gate connection electrode disposed on the second conductor layer and connected to the first gate electrode pad.

The semiconductor device may further include first and second conductor vias connecting the pair of first source electrode pads to a ground surface of the substrate. The ground surface may be disposed on another surface of the substrate.

The first gate electrode fingers may be disposed between the pair of first source electrode pads, the first source electrode finger, the first common electrode, and the second common electrode, respectively.

The first common electrode may be disposed between one of the pair of first source electrode pads and the first source electrode finger, extends up to a space between two of the second drain electrode fingers, and may be integrally formed of one conductor wiring.

The second common electrode may be disposed between the other of the pair of first source electrode pads and the first source electrode finger, extends up to a space between other two of the second drain electrode fingers, and is integrally formed of one conductor wiring.

The semiconductor device may further include a first gate connection pad, a first source connection finger, a pair of first source connection pads, second drain connection fingers, and a second drain connection pad. The first gate connection pad may be disposed on an intermediate connection layer and connected to the first gate electrode pad and a first gate connection electrode, the intermediate connection layer being stacked between the first conductor layer and the second conductor layer. The first source connection finger may be disposed on the intermediate connection layer and connected to the first source electrode finger and the first source connection electrode. The pair of first source connection pads may be disposed on the intermediate connection layer and connected to the pair of first source electrode pads and the first source connection electrode. Second drain connection fingers, spaced apart from each other, may be disposed on the intermediate connection layer and connected to the second drain electrode fingers and the second drain connection electrode. The second drain connection pad may be disposed on the intermediate connection layer and connected to the second drain electrode pad and the second drain connection electrode.

The semiconductor device may further include a pair of first source ohmic pads disposed on an ohmic layer between the pair of first source electrode pads and the substrate, the ohmic layer being stacked beneath the first conductor layer, a first source ohmic finger disposed on the ohmic layer between the first source electrode finger and the substrate, first and second common ohmic fingers disposed on the ohmic layer between the first and second common electrodes and the substrate, and second drain ohmic fingers, spaced apart from each other, disposed on the ohmic layer between the second drain electrode fingers and the substrate.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
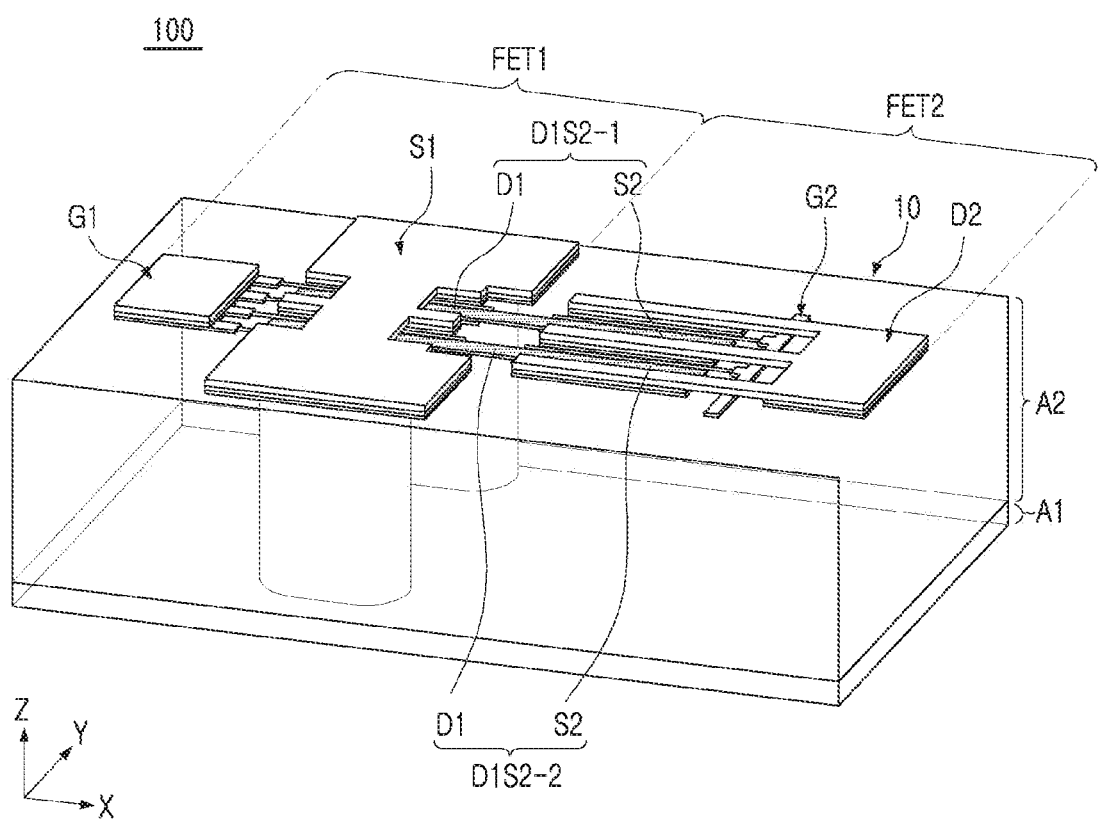
FIG. 1 is a perspective view illustrating an example of a disposition structure of a semiconductor device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a perspective view illustrating an example of a disposition structure of a semiconductor device.

Referring to FIG. 1, a semiconductor device may include a substrate 10, a first field effect transistor (FET) part FET1 and a second FET part FET2. The first FET part FET1 may include a first gate electrode region G1 and a first source electrode region S1, and the second FET part FET2 may include a second gate electrode region G2 and a second drain electrode region D2. In addition, the first FET part FET1 and the second FET part FET2 may include a first common electrode D1S2-1 and a second common electrode D1S2-2.

The substrate 10 may include a surface A1 and another surface A2 opposing the surface A1. As an example, the substrate 10 may be a base die on which a circuit pattern may be formed.

The first FET part FET1 and the second FET part FET2 may be disposed on the surface A2 of the substrate 10, and connected to each other in a stacked structure. As an example, the stacked structure may be a cascode structure in which each of drain electrodes of the first FET part FET1 and each of source electrodes of the second FET part FET2 are connected to each other in a one-to-one manner.

The first gate electrode region G1 and the first source electrode region S1 of the first FET part FET1 may be disposed on the surface A2 of the substrate 10 and spaced apart from each other.

The second gate electrode region G2 and the second drain electrode region D2 of the second FET part FET2 may be disposed on the surface A2 of the substrate 10 and spaced apart from each other.

The first common electrode D1S2-1 and the second common electrode D1S2-2 may be disposed on another surface of the substrate 10 to be spaced apart from each other.

Each of the first common electrode D1S2-1 and the second common electrode D1S2-2 may be formed of a single conductor wiring formed integrally by including the first drain electrode D1 of the first FET part FET1 and the second source electrode S2 of the second FET part FET2.

As an example, the first common electrode D1S2-1 and the second common electrode D1S2-2 may be disposed with each other in parallel without being bent.

In the respective drawings in the present disclosure, an unnecessary overlapping description for components denoted by the same reference numerals and having the same functions will be omitted, and contents different from each other in the respective drawings will be described.

In addition, in the respective embodiments in the present disclosure, an electrode pad may have an area greater than that of an electrode finger, the electrode finger may have an area smaller than that of the electrode pad, and an electrode bus may have a width similar or equal to that of the electrode finger and smaller than that of the electrode pad. Particularly, a first gate finger and a second gate finger may be formed to have widths smaller than those of other source fingers or drain fingers.

In the present embodiment, the FET may be, for example, a pseudomorphic high electron mobility transistor (pHEMT).

In the respective drawings of the present disclosure, the first gate electrode region G1, the first source region S1, the first common electrode D1S2-1, the second common electrode D152-2, the second gate electrode region G2, and the second drain region D2 may be sequentially disposed from the left toward the right, or vice versa.

Figure 2:
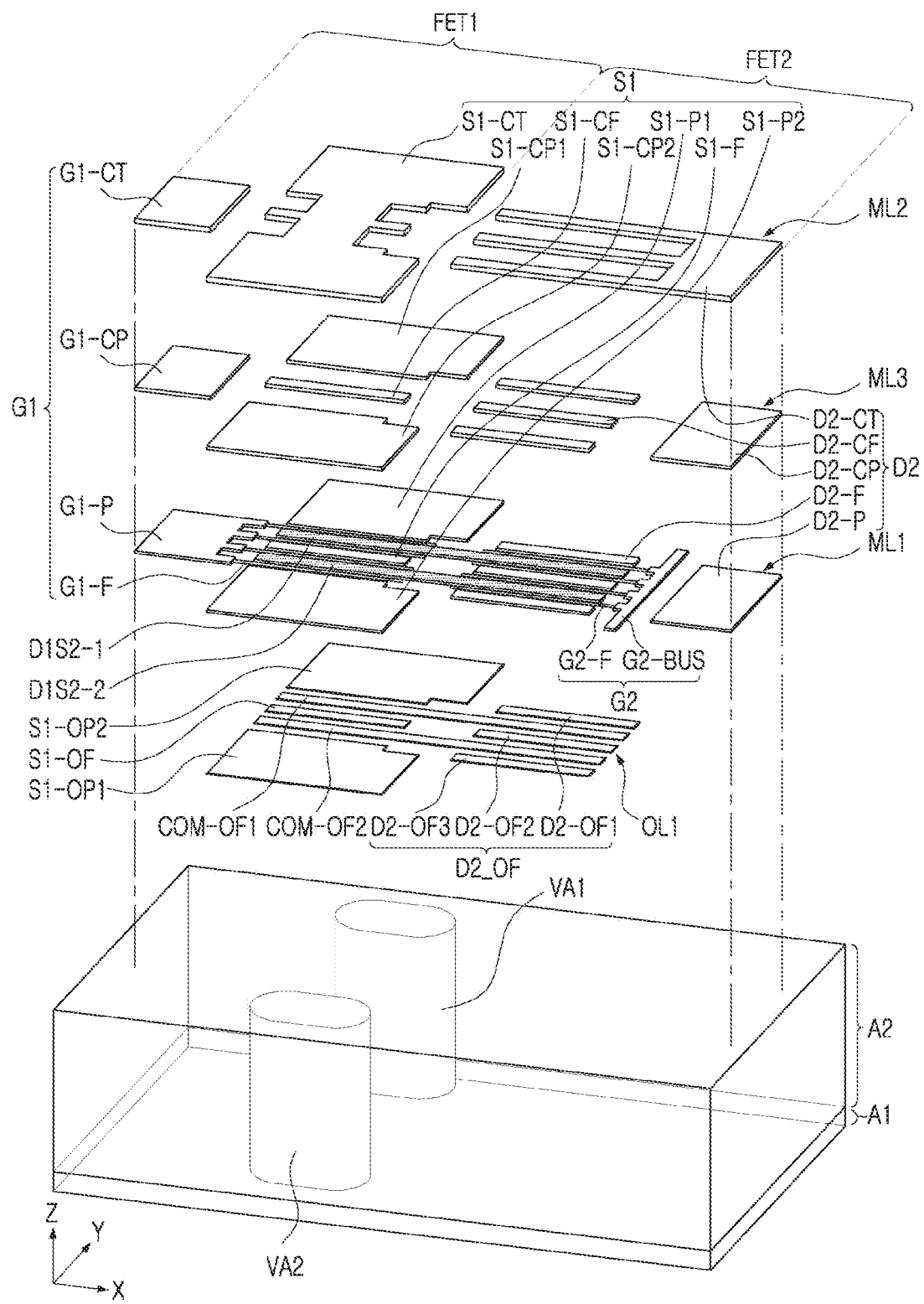
FIG. 2 is an exploded perspective view illustrating the example of the disposition structure of the semiconductor device of FIG. 1.
Figure 3:
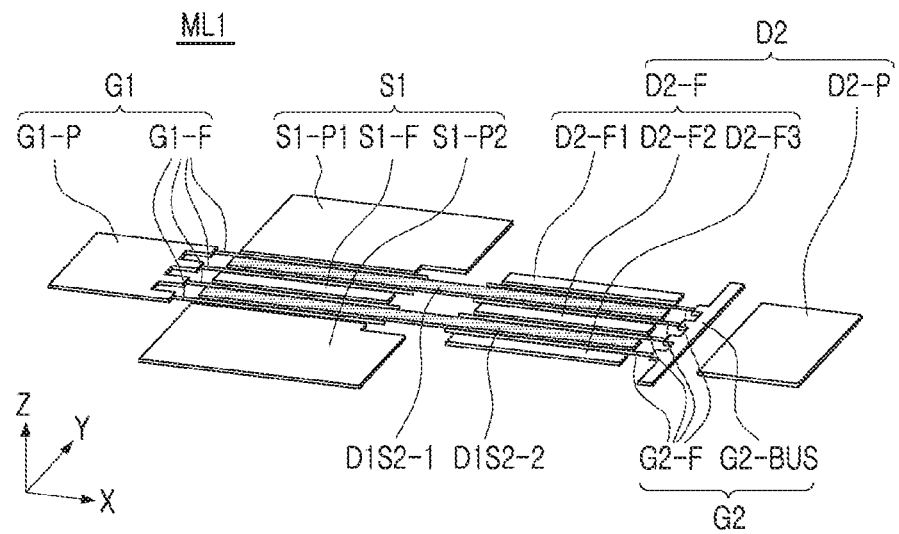
FIG. 3 is a view illustrating an example of a disposition structure of a first conductor layer of FIG. 2.
Figure 4:
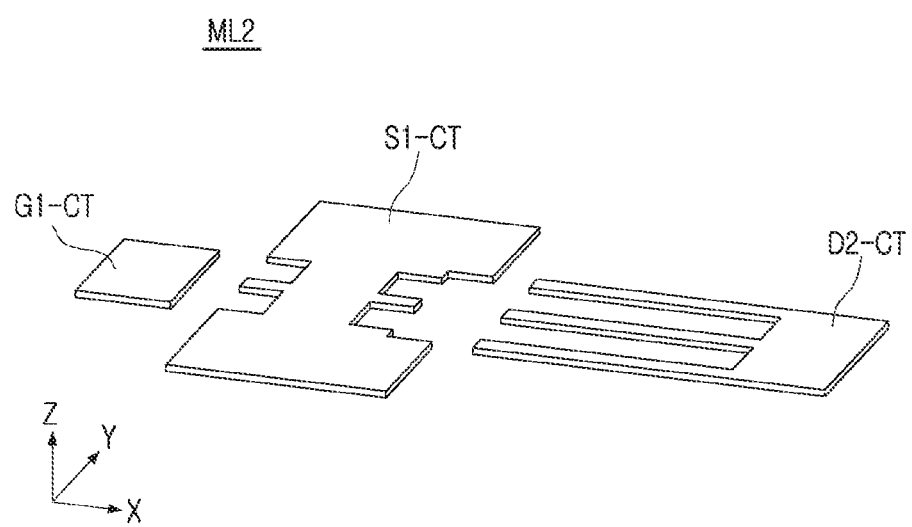
FIG. 4 is a view illustrating an example of a disposition structure of a second conductor layer of FIG. 2.
Figure 5:
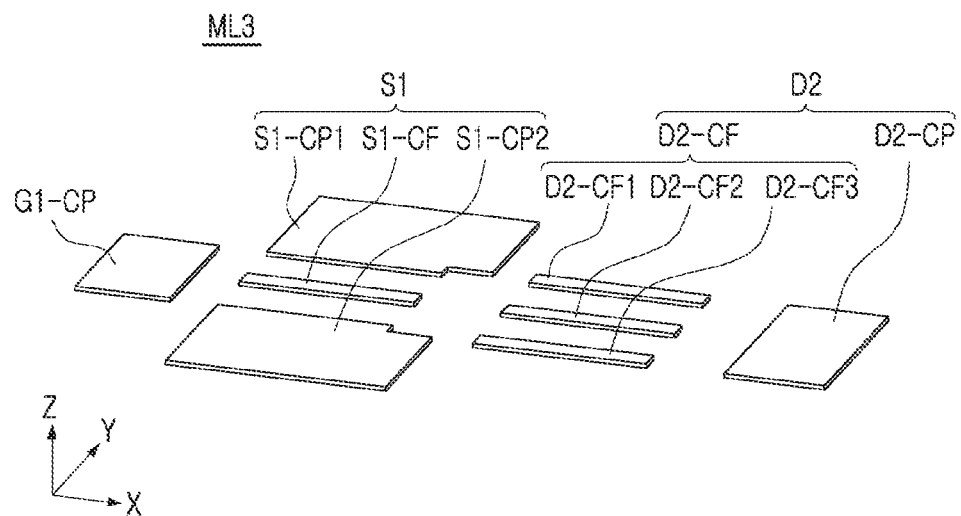
FIG. 5 is a view illustrating an example of a disposition structure of an intermediate connection layer of FIG. 2.
Figure 6:
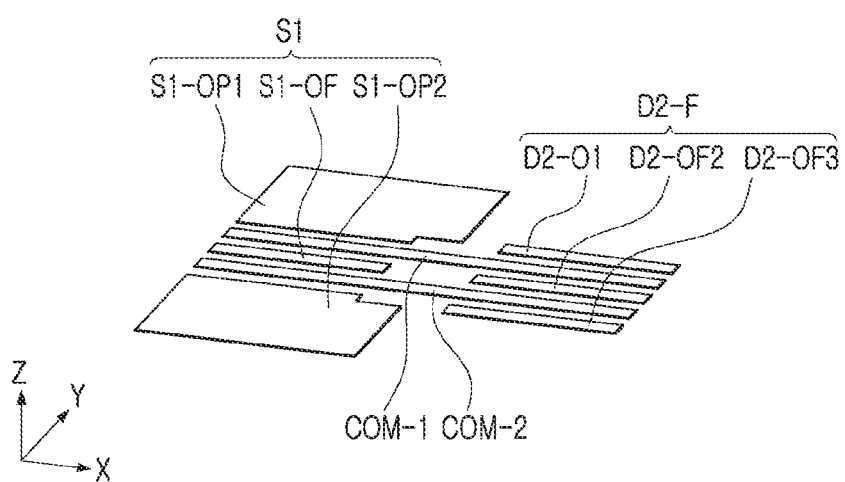
FIG. 6 is a view illustrating an example of a disposition structure of an ohmic layer of FIG. 2.
Figure 7:
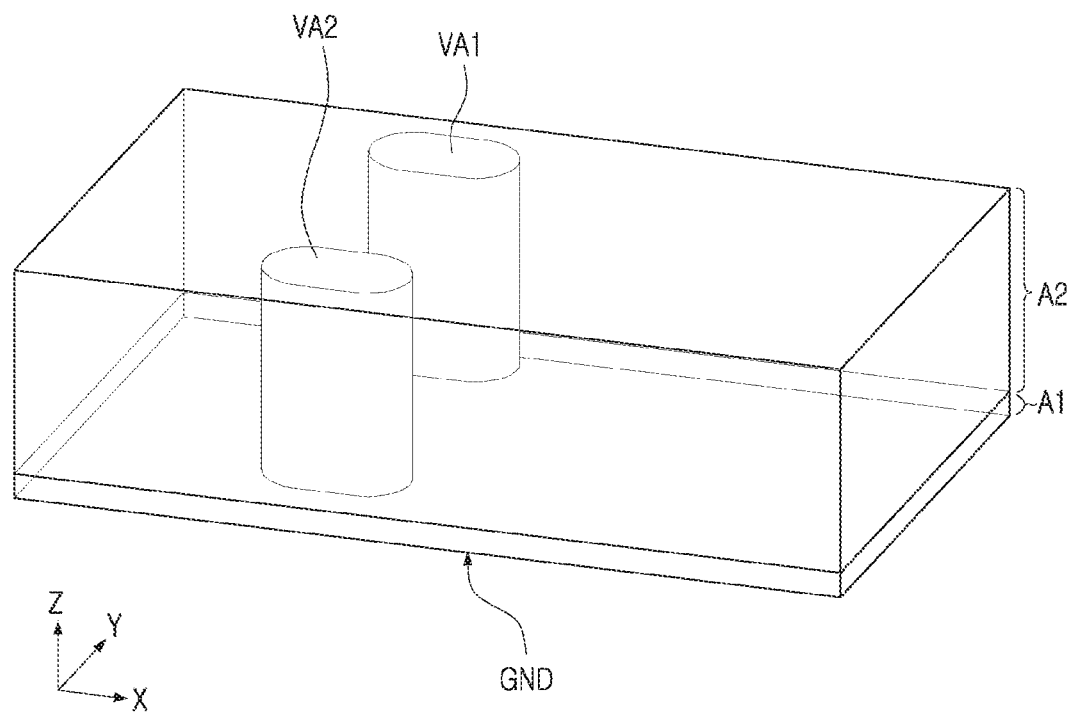
FIG. 7 is a view illustrating an example of first and second conductor vias of FIG. 2.

FIG. 2 is an exploded perspective view illustrating the example of the disposition structure of the semiconductor device of FIG. 1, FIG. 3 is a view illustrating a disposition structure of a first conductor layer of FIG. 2, FIG. 4 is a view illustrating a disposition structure of a second conductor layer of FIG. 2, FIG. 5 is a view illustrating a disposition structure of an intermediate connection layer of FIG. 2, and FIG. 6 is a view illustrating an example of a disposition structure of an ohmic layer of FIG. 2. In addition, FIG. 7 is a view illustrating an example of first and second conductor vias of FIG. 2.

Electrode dispositions and electrode structures of the first FET part FET1 and the second FET part FET2 disposed on a first conductor layer will be described with reference to FIGS. 2 and 3.

In FIG. 3, the first gate electrode region G1 may include a plurality of first gate electrode fingers G1-F and one first gate electrode pad G1-P.

The plurality of first gate electrode fingers G1-F may be disposed on a first conductor layer ML1 to be spaced apart from each other. The first conductor layer ML1 may be formed on the surface A2 of the substrate 10. As an example, the plurality of first gate electrode fingers G1-F: G1-F1, G1-F2, G1-F3, and G1-F4 may be four electrode fingers spaced apart from each other.

The first gate electrode pad G1-P may be disposed on the first conductor layer ML1, and be connected to each of the plurality of first gate electrode fingers G1-F.

The first source electrode region S1 may include a pair of first source electrode pads S1-P1 and S1-P2 and one first source electrode finger S1-F.

The pair of first source electrode pads S1-P1 and S1-P2 may be two electrode pads S1-P1 and S1-P2 disposed on the first conductor layer ML1 to be spaced apart from each other.

The first source electrode finger S1-F may be disposed on the first conductor layer ML1, between the two electrode pads S1-P1 and S1-P2 of the pair of first source electrode pads S1-P1 and S1-P2, and spaced apart from the pair of first source electrode pads S1-P1 and S1-P2.

As an example, each of the first common electrode D1S2-1 and the second common electrode D1S2-1 may be formed to have a length greater than that of the first source electrode finger S1-F.

The second gate electrode region G2 may include a plurality of second gate electrode fingers G2-F: G2-F1 to G2-F4 and one second gate electrode bus G2-BUS.

As an example, the plurality of second gate electrode fingers G2-F: G2-F1, G2-F2, G2-F3, and G2-F4 may be disposed on the first conductor layer ML1, and be spaced apart from each other by the first common electrode D152-1 and the second common electrode D152-2. As an example, the plurality of second gate electrode fingers G2-F: G2-F1 to G2-F4 may be four electrode fingers G2-F1 to G2-F4 spaced apart from each other.

As an example, the second gate electrode bus G2-BUS may be disposed on the first conductor layer ML1, and be connected to each of the plurality of second gate electrode fingers G2-F.

The second drain electrode region D2 may include a plurality of second drain electrode fingers D2-F and one second drain electrode pad D2-P.

The plurality of second drain electrode fingers D2-F may be disposed on the first conductor layer ML1, and spaced apart from each other by the first common electrode D1S2-1 and the second common electrode D1S2-2. As an example, the plurality of second drain electrode fingers D2-F may be three electrode fingers D2-F1 to D2-F3 spaced apart from each other.

The second drain electrode pad D2-P may be disposed on the first conductor layer ML1, spaced apart from each of the plurality of second drain electrode fingers D2-F: D2-F1 to D2-F3, and connected to each of the plurality of second drain electrode fingers D2-F through a second drain connection electrode D2-CT of a second conductor layer ML2.

As an example, each of the first common electrode D1S2-1 and the second common electrode D1S2-2 may be formed to have a length greater than that of each of the second drain electrode fingers D2-F: D2-F1 to D2-F3.

As an example, each of the first common electrode D1S2-1 and the second common electrode D1S2-2 may be formed to have a length greater than the sum of the length of each of the second drain electrode fingers D2-F: D2-F1 to D2-F3 and the length of the first source electrode finger S1-F.

The second gate electrode bus G2-BUS may be disposed after the first and second common electrodes D1S2-1 and D1S2-2 and before the second drain electrode pad D2-P. The second gate electrode bus G2-BUS may be spaced apart from each of the first and second common electrodes D1S2-1 and D1S2-2 and the second drain electrode pad D2-P.

As an example, the second gate electrode bus G2-BUS may be formed to have a width smaller than that of the second drain electrode pad D2-P, such that a separate second gate electrode pad may not be formed. Therefore, a small area may be occupied to contribute to miniaturization of the semiconductor device.

Particularly, the first common electrode D1S2-1 and the second common electrode D1S2-2 each including the first drain electrode D1 of the first FET part FET1 and the second source electrode S2 of the second FET part FET2 may be formed, such that a separate first drain electrode pad and second source electrode pad are not required in the respective exemplary embodiments in the present disclosure. Therefore, a small area may be occupied to contribute to the miniaturization of the semiconductor device.

For example, the first source electrode finger S1-F may be disposed between the two electrode pads S1-P1 and S1-P2 of the pair of first source electrode pads S1-P1 and S1-P2. The first common electrode D1S2-1 may be disposed between one S1-P1 of the two electrode pads S1-P1 and S1-P2 of the pair of first source electrode pads S1-P1 and S1-P2 and the first source electrode finger S1-F. The second common electrode D1S2-2 may be disposed between the other S1-P2 of the two electrode pads S1-P1 and S1-P2 of the pair of first source electrode pads S1-P1 and S1-P2, and the first source electrode finger S1-F.

As an example, the four first gate electrode fingers G1-F may be disposed between the pair of first source electrode pads S1-P1 and S1-P2, the first source electrode finger S1-F, the first common electrode D1S2-1, and the second common electrode D1S2-2, respectively.

For example, the first common electrode D1S2-1, and the second common electrode D1S2-2 may be disposed between the three second drain finger electrode fingers D2-F: D2-F1 to D2-F3, respectively, and the four second gate electrode fingers G2-F: G2-F1 to G2-F4 may be disposed between the three second drain finger electrode fingers D2-F: D2-F1 to D2-F3, the first common electrode D1S2-1, and the second common electrode D1S2-2, respectively.

Electrode dispositions and electrode structures of the first FET part FET1 and the second FET part FET2 disposed on the second conductor layer ML2 will be described with reference to FIGS. 2 and 4.

In FIG. 4, the first source electrode region S1 may include a first source connection electrode S1-CT. The first source connection electrode S1-CT may be disposed on the second conductor layer ML2 stacked on the first conductor layer ML1, and connected to the first source electrode finger S1-F and the pair of first source electrode pads S1-P1 and S1-P2. As an example, the first source connection electrode S1-CT may be formed in a 'Ⅲ' shape in order to be connected to be the one first source electrode finger S1-F and the two first source electrode pads S1-P1 and S1-P2.

The second drain electrode region D2 may include a second drain connection electrode D2-CT. The second drain connection electrode D2-CT may be disposed on the second conductor layer ML2, and connected to the plurality of second drain electrode fingers D2-F and the second drain electrode pad D2-P that are disposed on the first conductor layer ML1. As an example, the second drain connection electrode D2-CT may be formed in a 'Ǝ' shape in order to be connected to the three second drain electrode fingers D2-F: D2-F1 to D2-F3 and the one second drain electrode pad D2-P.

The first gate electrode region G1 may include a first gate connection electrode G1-CT. The first gate connection electrode G1-CT may be disposed on the second conductor layer ML2 and be connected to the first gate electrode pad G1-P.

Referring to FIGS. 2 through 4, the plurality of first gate electrode fingers G1-F may be disposed between the pair of first source electrode pads S1-P1 and S1-P2, the first source electrode finger S1-F, the first common electrode D1S2-1, and the second common electrode D1S2-2, respectively.

Again referring to FIG. 3, the first common electrode D1S2-1 may be disposed between one S1-P1 of the pair of first source electrode pads S1-P1 and S1-P2 and the first source electrode finger S1-F, may extend up to a space between two D2-F1 and D2-F2 of the plurality of second drain electrode fingers D2-F, and may be integrally formed of one conductor wiring.

The second common electrode D1S2-2 may be disposed between the other S1-P2 of the pair of first source electrode pads S1-P1 and S1-P2 and the first source electrode finger S1-F, may extend up to a space between other two D2-F2 and D2-F3 of the plurality of second drain electrode fingers D2-F, and may be integrally formed of one conductor wiring.

Electrode dispositions and electrode structures of the first FET part FET1 and the second FET part FET2 disposed on an intermediate connection layer ML3 will be described with reference to FIGS. 2 and 5.

In FIG. 5, the semiconductor device may include a first gate connection pad G1-CP, a first source connection finger S1-CF, a pair of first source connection pads S1-CP1 and S1-CP2, a plurality of second drain connection fingers D2-CF, and a second drain connection pad D2-CP.

The first gate connection pad G1-CP may be disposed on the intermediate connection layer ML3 stacked between the first conductor layer ML1 and the second conductor layer ML2, and be connected to the first gate electrode pad G1-P disposed on the first conductor layer ML1 and the first gate connection electrode G1-CT disposed on the second conductor layer ML2.

The first source connection finger S1-CF may be disposed on the intermediate connection layer ML3, and connected to the first source electrode finger S1-F disposed on the first conductor layer ML1 and the first source connection electrode S1-CT disposed on the second conductor layer ML2.

The pair of first source connection pads S1-CP1 and S1-CP2 may be disposed on the intermediate connection layer ML3, and be connected to the pair of first source electrode pads S1-P1 and S1-P2 disposed on the first conductor layer ML1 and the first source connection electrode S1-CT disposed on the second conductor layer ML2.

As an example, the first source connection finger S1-CF may be disposed between the two electrode pads S1-P1 and S1-P2 of the pair of first source electrode pads S1-P1 and S1-P2.

The plurality of second drain connection fingers D2-CF may be disposed on the intermediate connection layer ML3, be connected to the plurality of second drain electrode fingers D2-F disposed on the first conductor layer ML1 and the second drain connection electrode D2-CT disposed on the second conductor layer ML2, and be disposed to be spaced apart from each other.

The second drain connection pad D2-CP may be disposed on the intermediate connection layer ML3, and connected to the second drain electrode pad D2-P disposed on the first conductor layer ML1 and the second drain connection electrode D2-CT disposed on the second conductor layer ML2.

Meanwhile, in the respective embodiments in the present disclosure, each of the first conductor layer, the second conductor layer, and the intermediate connection layer may be a metal layer. Here, the metal layer refers to a layer including a conductor electrode pattern having a conductive material to conduct electricity therethrough.

Dispositions and structures of an ohmic pad and an ohmic finger disposed on an ohmic layer OL1 will be described with reference to FIGS. 2 and 6.

The semiconductor device may include a pair of first source ohmic pads S1-OP1 and S1-OP2, a first source ohmic finger S1-OF, first and second common ohmic fingers COM-OF1 and COM-OF2, and a plurality of second drain ohmic fingers D2-OF in order to form an ohmic contact between the drain electrode and the source electrode of each of the first and second FET parts FET1 and FET2 and the substrate.

The pair of first source ohmic pads S1-OP1 and S1-OP2 may be disposed on the ohmic layer OL1 stacked beneath the first conductor layer ML1, and between the pair of first source electrode pads S1-P1 and S1-P2 disposed on the first conductor layer ML1 and the substrate 10.

The first source ohmic finger S1-OF may be disposed on the ohmic layer OL1, and between the first source electrode finger S1-F disposed on the first conductor layer ML1 and the substrate 10.

The first and second common ohmic fingers COM-OF1 and COM-OF2 may be disposed on the ohmic layer OL1, and between the first common electrode D1S2-1 and the second common electrode D1S2-2 disposed on the first conductor layer ML1 and the substrate 10.

The plurality of second drain ohmic fingers D2-OF may be disposed on the ohmic layer OL1, between the plurality of second drain electrode fingers D2-F disposed on the first conductor layer ML1 and the substrate 10, and be spaced apart from each other.

Referring to FIGS. 2 and 7, the substrate 10 may include a ground surface GND formed on the one surface, and first and second conductor vias VA1 and VA2. The first and second conductor vias VA1 and VA2 may connect the pair of first source electrode pads S1-P1 and S1-P2 to the ground surface GND of the substrate 10, respectively.

Both ends of the second gate electrode bus G2-BUS may be connected to the ground surface GND of the substrate 10 through first and second capacitors C1 and C2, respectively.

Figure 8:
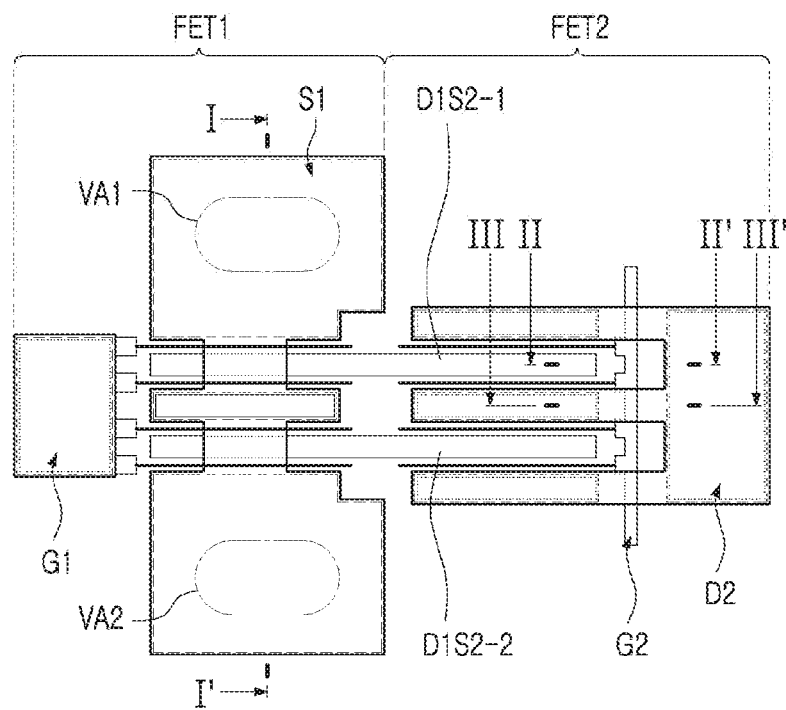
FIG. 8 is a plan perspective view illustrating the semiconductor device.
Figure 9:
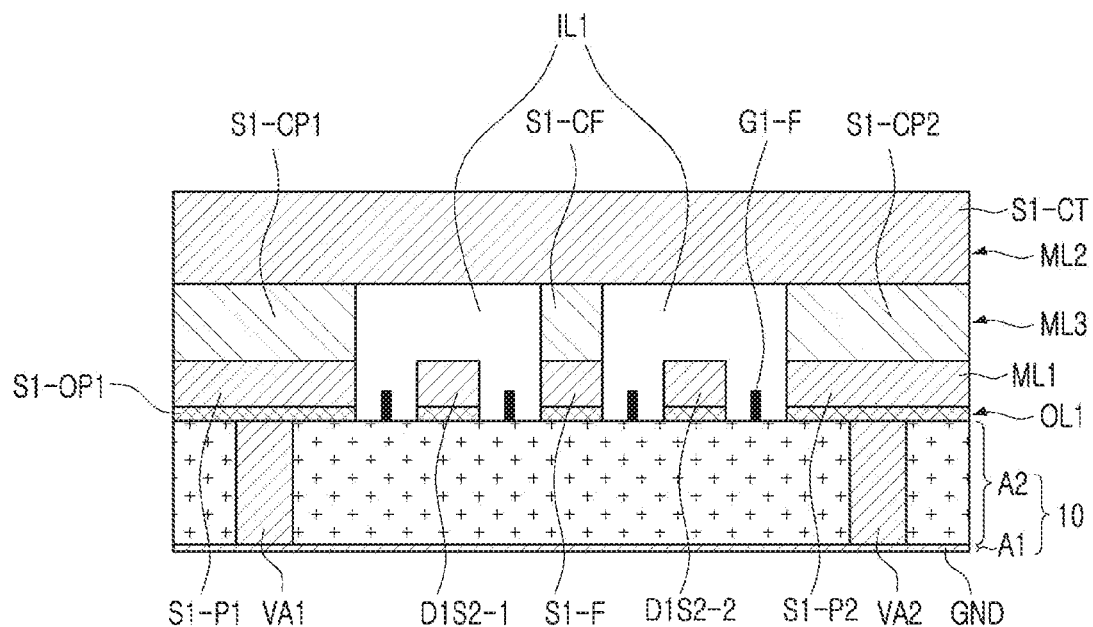
FIG. 9 is a cross-sectional view taken along line I-I' of FIG. 8.
Figure 10:
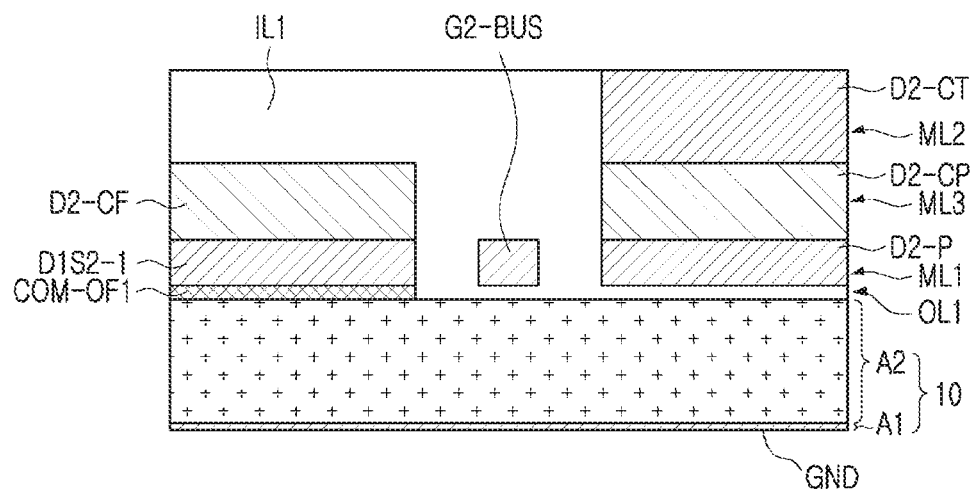
FIG. 10 is a cross-sectional view taken along line II-II' of FIG. 8.
Figure 11:
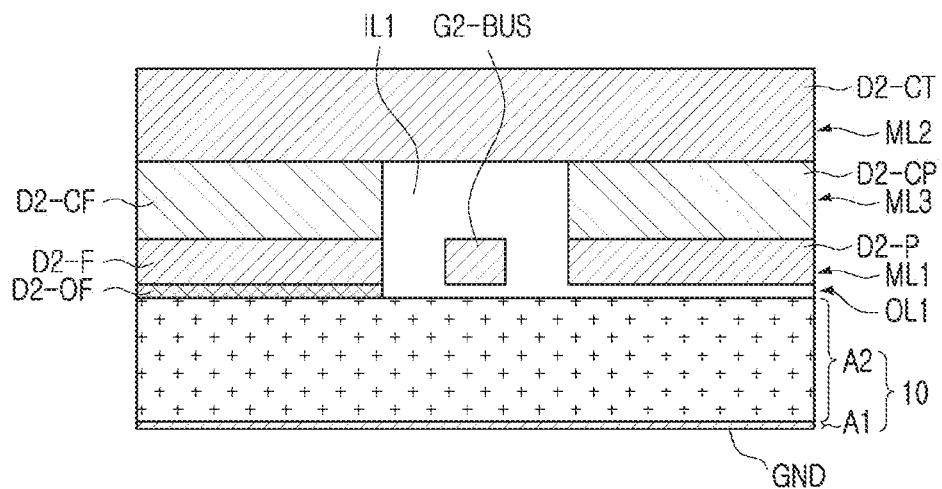
FIG. 11 is a cross-sectional view taken along line III-III' of FIG. 8.

FIG. 8 is a plan perspective view illustrating the semiconductor device, FIG. 9 is a cross-sectional view taken along line I-I' of FIG. 8, FIG. 10 is a cross-sectional view taken along line II-II' of FIG. 8, and FIG. 11 is a cross-sectional view taken along line III-III' of FIG. 8.

Referring to a cross-sectional view taken along line I-I' of the semiconductor device illustrated in FIGS. 8 and 9, the ground surface GND may be formed on the one surface A1 of the substrate, and the ohmic layer OL1, the first conductor layer ML1, the intermediate connection layer ML3, and the second conductor layer ML2 may be sequentially stacked on the other surface A2 of the substrate. As an example, the substrate 10 may be formed of gallium arsenide (GaAs).

One S1-P1 of the pair of first source electrode pads S1-P1 and S1-P2 may be connected to one S1-OP1 of the pair of first source ohmic pads S1-OP1 and S1-OP2, and one S1-OP1 of the pair of first source ohmic pads S1-OP1 and S1-OP2 may be connected to the ground GND through the first conductor via VA1. In addition, one S1-P1 of the pair of first source electrode pads S1-P1 and S1-P2 may be connected to the first source connection electrode S1-CT through one S1-CP1 of the pair of first source connection pads S1-CP1 and S1-CP2.

As an example, each of the first source connection electrode S1-CT, the pair of first source connection pads S1-CP1 and S1-CP2, the pair of first source electrode pads S1-P1 and S1-P2, the pair of first source ohmic pads S1-OP1 and S1-OP2, and the first and second conductive vias VA1 and VA2 may be formed of gold (Au). An insulating layer formed of silicon nitride (SiN), an insulating film (PI), or the like, is denoted by IL1.

Referring to a cross-sectional view taken along line II-II' of the semiconductor device illustrated in FIGS. 8 and 10, the ground surface GND may be formed on the one surface A1 of the substrate, and the ohmic layer OL1, the first conductor layer ML1, the intermediate connection layer ML3, and the second conductor layer ML2 may be sequentially stacked on the other surface A2 of the substrate.

On the other surface A2 of the substrate, the second drain electrode pad D2-P may be connected to the second drain connection electrode D2-CT through the second drain connection pad D2-CP.

Referring to a cross-sectional view taken along line III-III' of the semiconductor device illustrated in FIGS. 8 and 11, the ground surface GND may be formed on the one surface A1 of the substrate, and the ohmic layer OL1, the first conductor layer ML1, the intermediate connection layer ML3, and the second conductor layer ML2 may be sequentially stacked on the other surface A2 of the substrate.

On the other surface A2 of the substrate, the second drain electrode pad D2-P may be connected to the second drain connection electrode D2-CT through the second drain connection pad D2-CP.

In addition, the second drain electrode finger D2-F may be connected to the second drain connection electrode D2-CT through the second drain connection finger D2-CF, and may be connected to the second drain ohmic finger D2-OF.

Figure 12:
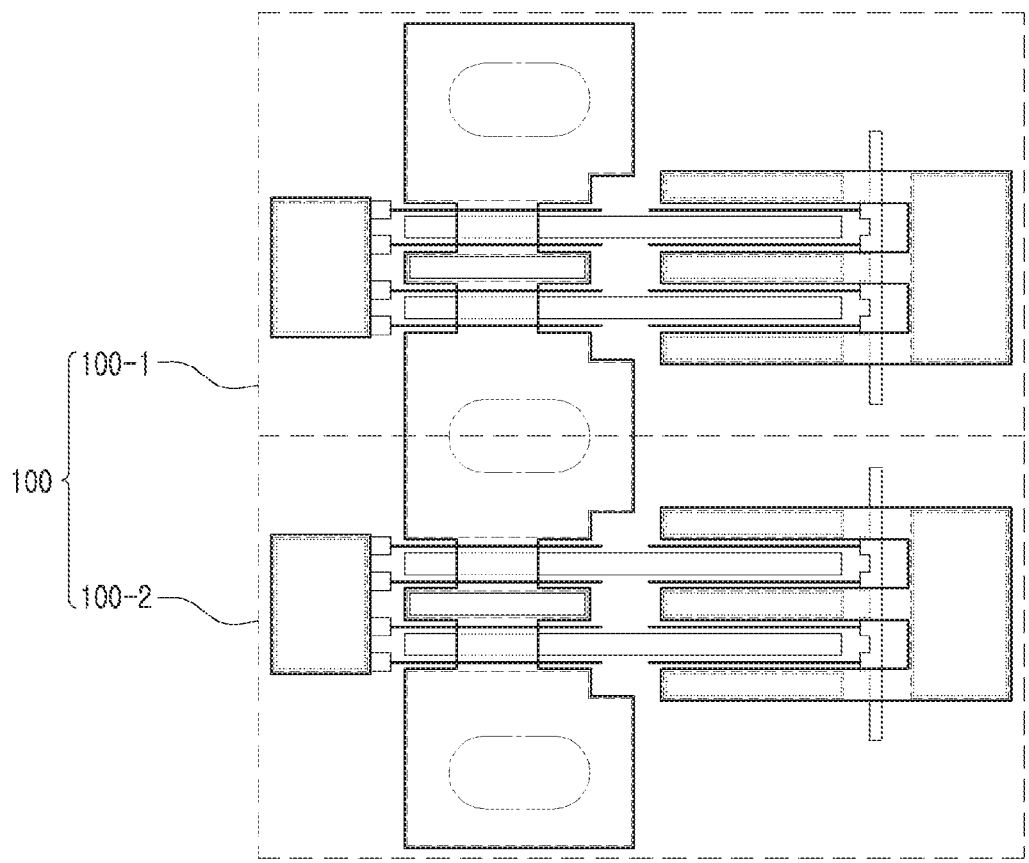
FIG. 12 is a view illustrating a first application example of the semiconductor device.
Figure 13:
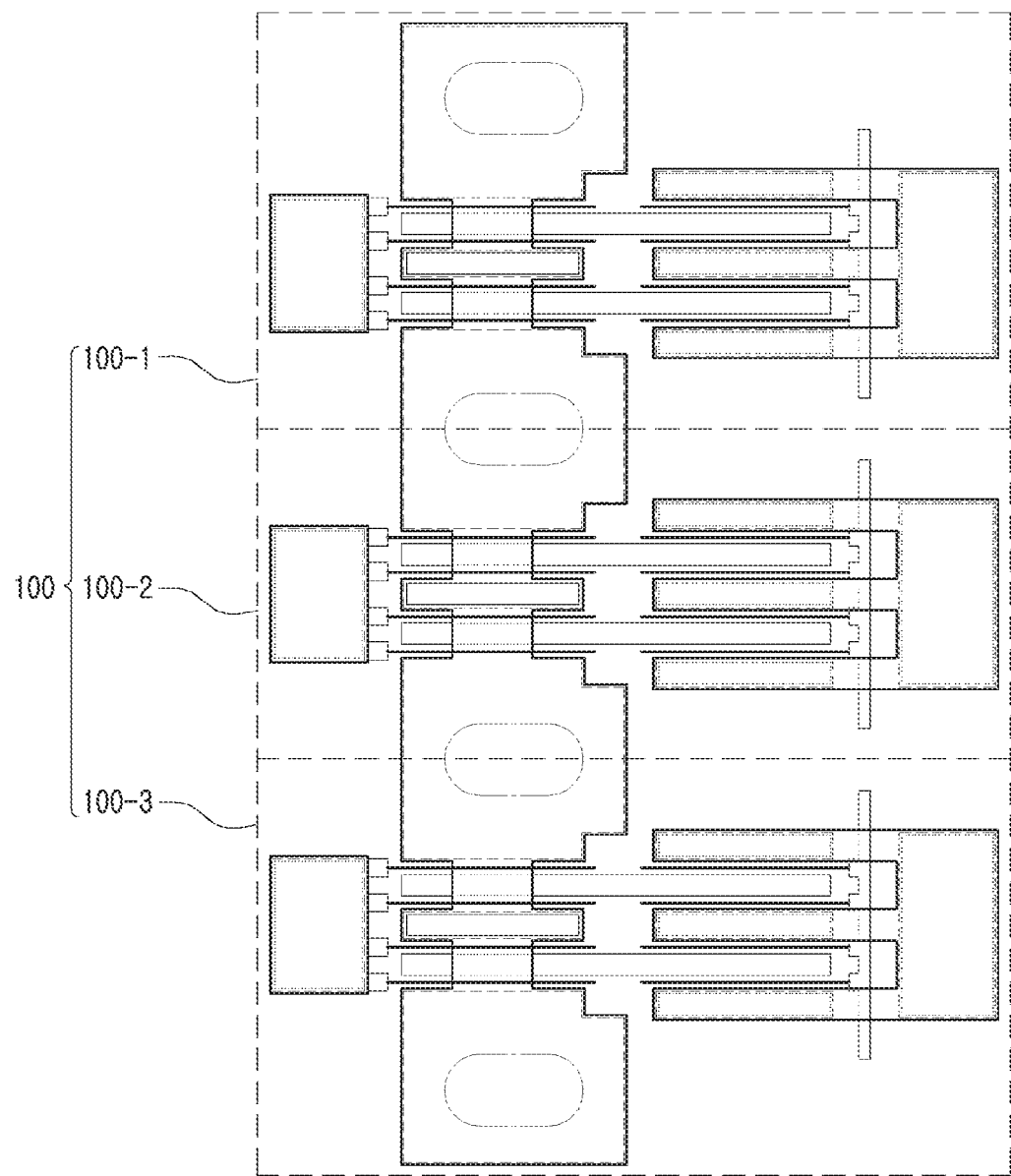
FIG. 13 is a view illustrating a second application example of the semiconductor device.
Figure 14:
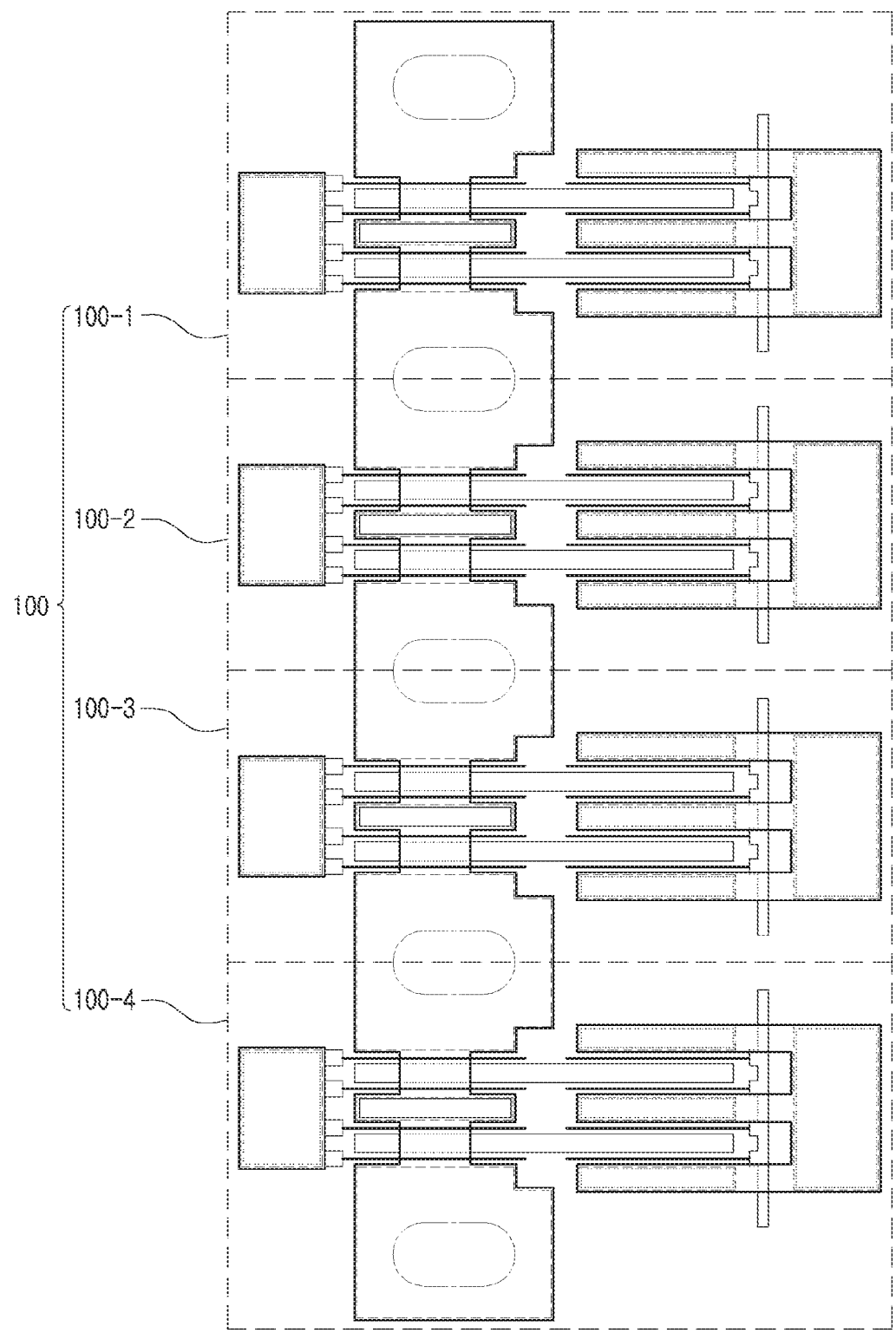
FIG. 14 is a view illustrating a third application example of the semiconductor device.

FIG. 12 is a view illustrating a first application example of the semiconductor device. FIG. 13 is a view illustrating a second application example of the semiconductor device. FIG. 14 is a view illustrating a third application example of the semiconductor device.

Referring to FIG. 12, a structure in which two unit semiconductor devices 100-1 and 100-2 corresponding to a unit semiconductor device illustrated in FIG. 1 are connected to each other in parallel is illustrated as the first application example of the semiconductor device.

Referring to FIG. 13, a structure in which three unit semiconductor devices 100-1, 100-2, and 100-3 corresponding to a unit semiconductor device illustrated in FIG. 1 are connected to each other in parallel is illustrated as the second application example of the semiconductor device.

Referring to FIG. 14, a structure in which four unit semiconductor devices 100-1, 100-2, 100-3, and 100-4 corresponding to a unit semiconductor device illustrated in FIG. 1 are connected to each other in parallel is illustrated as the third application example of the semiconductor device.

As illustrated in FIGS. 12 through 14, in a structure of the semiconductor device 100 in which several unit semiconductor devices are connected to each other in parallel, conductor vias positioned between the unit semiconductor devices may be shared between the unit semiconductor devices in order to miniaturize the manufactured semiconductor device.

Figure 15:
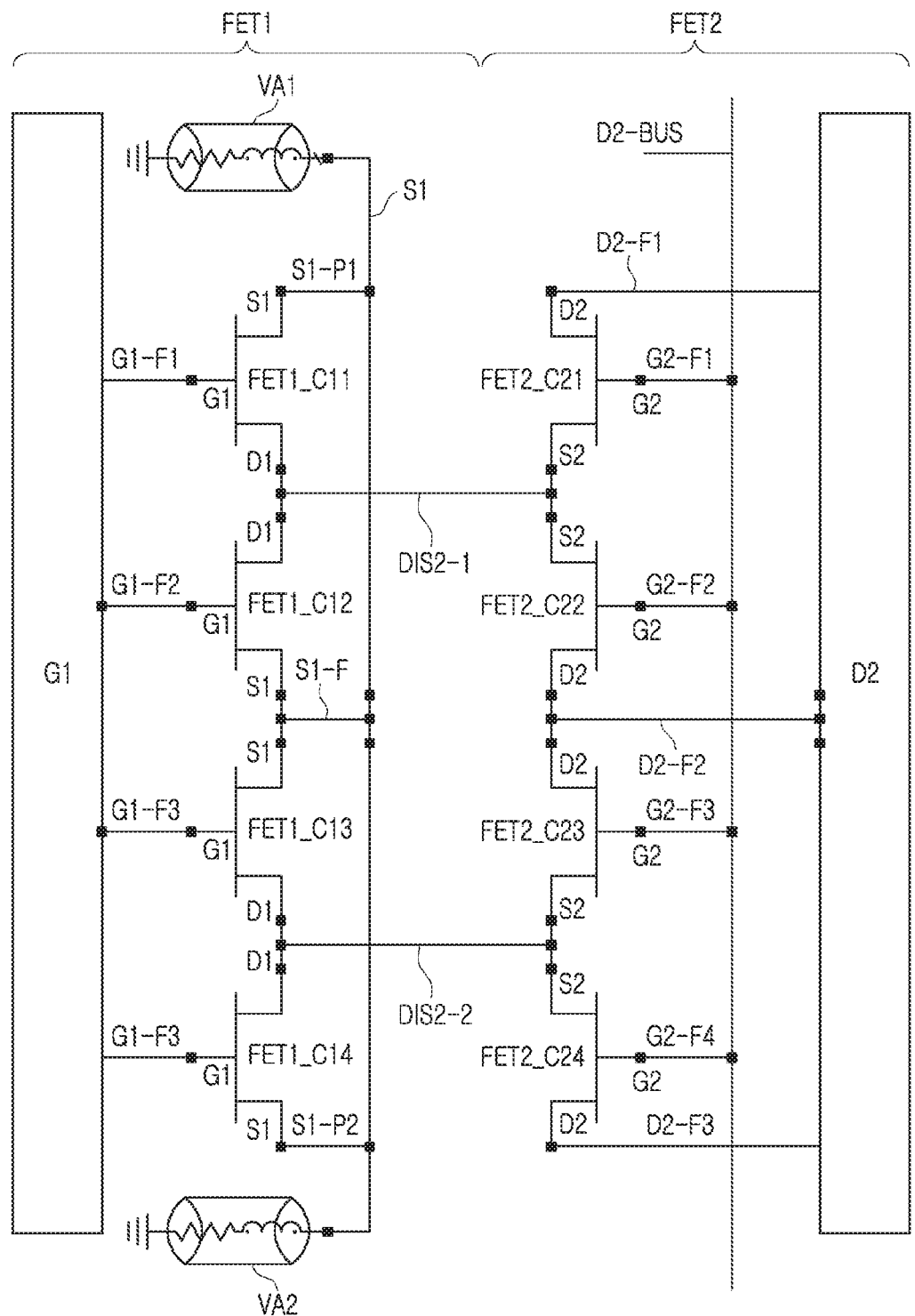
FIG. 15 is a circuit diagram illustrating an equivalent circuit of the disposition structure of the semiconductor device of FIG. 1.

FIG. 15 is a circuit diagram illustrating an equivalent circuit of the disposition structure of the semiconductor device of FIG. 1.

Referring to FIG. 15, as an example, the first FET part FET1 may include a first FET_cell1 FET1_C11, a first FET_cell2 FET1_C12, a first FET_cell3 FET1_C13, and a first FET_cell4 FET1_C14.

Gates of the first FET_cell1 FET1_C11, the first FET_cell2 FET1_C12, the first FET_cell3 FET1_C13, and the first FET_cell4 FET1_C14 may be connected to a common first gate electrode region G1 through the plurality of first gate electrode fingers G1-F: G1-F1, G1-F2, G1-F3, and G1-F4, respectively.

Sources of the first FET_cell1 FET1_C11, the first FET_cell2 FET1_C12, the first FET_cell3 FET1_C13, and the first FET_cell4 FET1_C14 may be connected in common to a common first source electrode region S1 through the pair of first source electrode pads S1-P1 and S1-P2 and the first source electrode finger S1-F.

Drains of the first FET_cell1 FET1_C11 and the first FET_cell2 FET1_C12 may be connected to the first common electrode D1S2-1, and drains of the first FET_cell3 FET1_C13 and the first FET_cell4 FET1_C14 may be connected to the second common electrode D1S2-2.

In addition, both ends of the first source electrode region S1 may be connected to a ground through the first and second conductor vias VA1 and VA2, and each of the first and second conductor vias VA1 and VA2 may be represented by a resistive element such as a resistor and an inductive element such as an inductor.

In addition, as an example, the second FET part FET2 may include a second FET_cell1 FET2_C21, a second FET_cell2 FET2_C22, a second FET_cell3 FET2_C23, and a second FET_cell4 FET2_C24.

Gates of the second FET_cell1 FET2_C21, the second FET_cell2 FET2_C22, the second FET_cell3 FET2_C23, and the second FET_cell4 FET2_C24 may be connected to a common second gate electrode bus G2-BUS through the plurality of second gate electrode fingers G2-F: G2-F1, G2-F2, G2-F3, and G2-F4, respectively.

Sources of the second FET_cell1 FET2_C21 and the second FET_cell2 FET2_C22 may be connected to the first common electrode D1S2-1, and sources of the second FET_cell3 FET2_C23 and the second FET_cell4 FET2_C24 may be connected to the second common electrode D1S2-2.

A drain of the second FET_cell1 FET2_C21 may be connected to a common second drain electrode region D2 through a first finger D2-F1 of the plurality of second drain electrode fingers D2-F, drains of the second FET_cell2 FET2_C22 and the second FET_cell3 FET2_C23 may be connected to the common second drain electrode region D2 through a second finger D2-F2 of the plurality of second drain electrode fingers D2-F, and a drain of the second FET_cell4 FET2_C24 may be connected to the common second drain electrode region D2 through a third finger D2-F3 of the plurality of second drain electrode fingers D2-F.

A case in which each of the first FET part FET1 and the second FET part FET2 includes four FET cells has been described above by way of example, but the present exemplary embodiment is not limited thereto, and each of the first FET part FET1 and the second FET part FET2 may include four or more FET cells.

Figure 16:
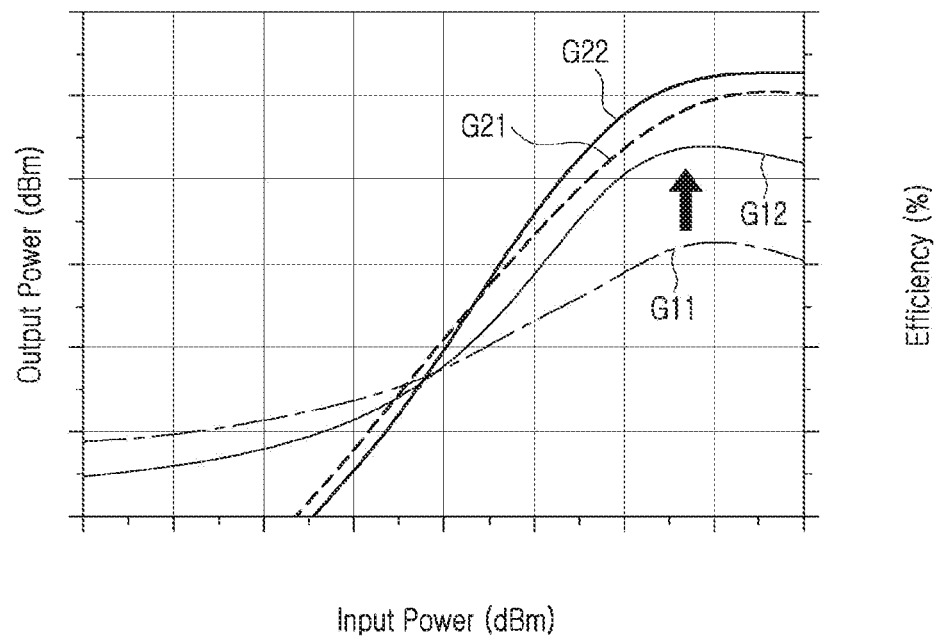
FIG. 16 is a graph illustrating the performance of the semiconductor device.

FIG. 16 is graphs illustrating the performance of the semiconductor device. In FIG. 16, G11 is a graph illustrating efficiency versus input power of a semiconductor device according to the related art, and G12 is a graph illustrating efficiency versus input power of a semiconductor device. G21 is a graph illustrating output power versus input power of the semiconductor device according to the related art, and G22 is a graph illustrating output power versus input power of the semiconductor device.

It may be seen from G11 and G12 of FIG. 16 that the efficiency of the semiconductor device is improved as compared to the semiconductor device according to the related art by approximately 10% or more.

It may be seen from G21 and G22 of FIG. 16 that output power of the semiconductor device is improved as compared to the semiconductor device according to the related art when input power is approximately 5 [dBM] or more.

The semiconductor device according to the present exemplary embodiment as described above is implemented to be appropriate for a power amplifier of 28 GHz but is not limited thereto.

As set forth above, in the present disclosure, in a disposition structure in which at least two FETs are stacked, each of a plurality of drain electrode fingers of one FET and each of a plurality of source electrode fingers of the other FET may be integrally formed of a single conductor wiring, such that pads connecting the plurality of drain electrode fingers and the plurality of source electrode fingers to each other are not present. Therefore, the length of an electrode wiring may be reduced, and the size of the semiconductor device may be reduced. As a result, efficiency in a stacked structure in which the gain is excellent may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
a substrate;
a first field effect transistor (FET) part, disposed on a surface of the substrate, comprising a first gate electrode region and a first source electrode region disposed on the surface of the substrate and spaced apart from each other, the first source electrode region comprising a pair of first source electrode pads directly contacting a first conductor layer and a first source connection electrode directly contacting a second conductor layer different from the first conductor layer;
a first gate connection pad disposed on an intermediate connection layer being different from the first conductor layer and the second conductor layer and stacked between the first conductor layer and the second conductor layer;
a first source connection finger disposed on the intermediate connection layer and connected to the first source connection electrode;
a pair of first source connection pads disposed on the intermediate connection layer and connected to the pair of first source electrode pads and the first source connection electrode;
second drain connection fingers, spaced apart from each other, disposed on the intermediate connection layer;
a second drain connection pad disposed on the intermediate connection layer; and
a second FET part, disposed on the surface of the substrate and connected to the first FET part in a stacked structure, comprising a second gate electrode region and a second drain electrode region disposed on the surface of the substrate and spaced apart from each other,
wherein each of the first FET part and the second FET part comprise a first common electrode and a second common electrode disposed on the surface of the substrate and spaced apart from each other, and
each of the first common electrode and the second common electrode is configured to be a single conductor wiring integrally formed by a first drain electrode of the first FET part and a second source electrode of the second FET part.

2. The semiconductor device of claim 1, wherein the first common electrode is linearly and parallelly disposed with the second common electrode.

3. The semiconductor device of claim 2, wherein the first gate electrode region comprises:
first gate electrode fingers, spaced apart from each other, disposed on the first conductor layer formed on the surface of the substrate; and
a first gate electrode pad disposed on the first conductor layer and connected to the first gate electrode fingers.

4. The semiconductor device of claim 3, wherein the first source electrode region further comprises:
the pair of first source electrode pads, spaced apart from each other, disposed on the first conductor layer; and
a first source electrode finger disposed on the first conductor layer, disposed between the pair of first source electrode pads, and spaced apart from the pair of first source electrode pads.

5. The semiconductor device of claim 4, wherein the second gate electrode region comprises:
second gate electrode fingers, spaced apart from each other, disposed on the first conductor layer; and
a second gate electrode bus disposed on the first conductor layer and connected to the second gate electrode fingers.

6. The semiconductor device of claim 5, wherein the second drain electrode region comprises:
second drain electrode fingers disposed on the first conductor layer and spaced apart from each other by the first common electrode and the second common electrode; and
a second drain electrode pad disposed on the first conductor layer and spaced apart from the second drain electrode fingers.

7. The semiconductor device of claim 6, wherein the second gate electrode bus is disposed after the first common electrode and the second common electrode and before the second drain electrode pad, and spaced apart from each of the first common electrode, the second common electrode and the second drain electrode pad.

8. The semiconductor device of claim 7, wherein the first source connection electrode disposed on the second conductor layer is connected to the first source electrode finger and the pair of first source electrode pads, and the second conductor layer is stacked on the first conductor layer.

9. The semiconductor device of claim 8, wherein the second drain electrode region further comprises a second drain connection electrode disposed on the second conductor layer and connected to the second drain electrode fingers and the second drain electrode pad.

10. The semiconductor device of claim 9, wherein the first gate electrode region further comprises a first gate connection electrode disposed on the second conductor layer and connected to the first gate electrode pad.

11. The semiconductor device of claim 9, further comprising first and second conductor vias connecting the pair of first source electrode pads to a ground surface of the substrate,
wherein the ground surface is disposed on another surface of the substrate.

12. The semiconductor device of claim 11, wherein each of the first gate electrode fingers is respectively disposed between the pair of first source electrode pads, the first source electrode finger, the first common electrode, and the second common electrode.

13. The semiconductor device of claim 12, wherein the first common electrode is disposed between one of the pair of first source electrode pads and the first source electrode finger, the first common electrode extends up to a space between two of the second drain electrode fingers, and is integrally formed of one conductor wiring.

14. The semiconductor device of claim 13, wherein the second common electrode is disposed between the other of the pair of first source electrode pads and the first source electrode finger, the first common electrode extends up to a space between other two of the second drain electrode fingers, and is integrally formed of one conductor wiring.

15. The semiconductor device of claim 14, wherein the first gate connection pad is connected to the first gate electrode pad and a first gate connection electrode,
the first source connection finger is further connected to the first source electrode finger, the second drain connection fingers are further connected to the second drain electrode fingers, and
the second drain connection pad is connected to the second drain electrode pad and the second drain connection electrode.

16. The semiconductor device of claim 14, further comprising:
a pair of first source ohmic pads disposed on an ohmic layer between the pair of first source electrode pads and the substrate, the ohmic layer being stacked beneath the first conductor layer;
a first source ohmic finger disposed on the ohmic layer between the first source electrode finger and the substrate;
first and second common ohmic fingers disposed on the ohmic layer between the first and second common electrodes and the substrate; and
second drain ohmic fingers, spaced apart from each other, disposed on the ohmic layer between the second drain electrode fingers and the substrate.

17. The semiconductor device of claim 1, wherein p1 the first gate connection pad is connected to a first gate electrode pad and a first gate connection electrode,
the first source connection finger is further connected to a first source electrode finger, the second drain connection fingers are further connected to second drain electrode fingers, and
the second drain connection pad is connected to a second drain electrode pad and a second drain connection electrode.

18. A semiconductor device, comprising:
a substrate;
a first field effect transistor (FET) part, disposed on a surface of the substrate, comprising a first gate electrode region and a first source electrode region disposed on the surface of the substrate and spaced apart from each other, the first source electrode region comprising a pair of first source electrode pads spaced apart from each other directly contacting a first conductor layer, a first source connection electrode directly contacting a second conductor layer different from the first conductor layer, and a first source electrode finger disposed on the first conductor layer, disposed between the pair of first source electrode pads, and spaced apart from the pair of first source electrode pads, the first gate electrode region comprising first gate electrode fingers, spaced apart from each other, disposed on the first conductor layer formed on the surface of the substrate and a first gate electrode pad disposed on the first conductor layer and connected to the first gate electrode fingers; and
a second FET part, disposed on the surface of the substrate and connected to the first FET part in a stacked structure, comprising a second gate electrode region and a second drain electrode region disposed on the surface of the substrate and spaced apart from each other, the second drain electrode region comprising second drain electrode fingers disposed on the first conductor layer and spaced apart from each other by the first common electrode and the second common electrode, a second drain electrode pad disposed on the first conductor layer and spaced apart from the second drain electrode fingers, and a second drain connection electrode disposed on the second conductor layer and connected to the second drain electrode fingers and the second drain electrode pad;
a first gate connection pad disposed on an intermediate connection layer and connected to the first gate electrode pad and a first gate connection electrode, the intermediate connection layer being different from the first conductor layer and the second conductor layer and stacked between the first conductor layer and the second conductor layer;
a first source connection finger disposed on the intermediate connection layer and connected to the first source electrode finger and the first source connection electrode;
a pair of first source connection pads disposed on the intermediate connection layer and connected to the pair of first source electrode pads and the first source connection electrode;
second drain connection fingers, spaced apart from each other, disposed on the intermediate connection layer and connected to the second drain electrode fingers and the second drain connection electrode; and
a second drain connection pad disposed on the intermediate connection layer and connected to the second drain electrode pad and the second drain connection electrode,
wherein each of the first FET part and the second FET part comprise a first common electrode and a second common electrode disposed on the surface of the substrate and spaced apart from each other, and
each of the first common electrode and the second common electrode is configured to be a single conductor wiring integrally formed by a first drain electrode of the first FET part and a second source electrode of the second FET part.

* * * * *